United States Patent [19]

DiSanto et al.

[11] Patent Number: 4,850,919
[45] Date of Patent: Jul. 25, 1989

[54] MONOLITHIC FLAT PANEL DISPLAY APPARATUS AND METHODS FOR FABRICATION THEREOF

[75] Inventors: Frank J. DiSanto, North Hills; Denis A. Krusos, Lloyd Harbor, both of N.Y.

[73] Assignee: Copytele, Inc., Huntington Station, N.Y.

[21] Appl. No.: 171,114

[22] Filed: Mar. 21, 1988

Related U.S. Application Data

[62] Division of Ser. No. 905,510, Sep. 11, 1986, Pat. No. 4,772,820.

[51] Int. Cl.$^4$ .............................................. H01J 9/18
[52] U.S. Cl. ......................................... 445/24; 445/25
[58] Field of Search .................... 445/24, 25, 35, 36, 445/37, 46, 50, 51

[56] References Cited

U.S. PATENT DOCUMENTS

| | | | |
|---|---|---|---|
| 4,139,250 | 2/1979 | Jacobs et al. | 445/25 |
| 4,422,731 | 12/1983 | Droguet et al. | 445/24 |
| 4,464,135 | 8/1984 | Andreadakis | 445/25 |
| 4,734,617 | 3/1988 | Jacobs et al. | 445/24 |

Primary Examiner—Kurt Rowan
Attorney, Agent, or Firm—Arthur L. Plevy

[57] ABSTRACT

Methods for fabricating monolithic flat panel displays together with the resulting display are disclosed in accordance with the teachings of the present invention. According to the invention the end portions of the row and column conductors of a display panel are metalized, grouped and patterned to accept a driver circuit within the pattern of each group. The driver circuit is then bonded to the panel and each output of the driver circuit to be employed is wire bonded to the patterned conductor portions within the group associated therewith. Inputs to the driver circuit may also be wire bonded to input conductors provided on the panel to provide an integral one piece structure.

13 Claims, 3 Drawing Sheets

MONOLITHIC FLAT PANEL DISPLAY APPARATUS AND METHODS FOR FABRICATION THEREOF

This is a division of application Ser. No. 905,570 filed Sept. 11, 1986 now U.S. Pat. No. 4,772,820.

BACKGROUND

This invention relates to monolithic flat panel display apparatus and methods for fabrication thereof and more particularly to techniques for metalizing portions of the large number of finely spaced conductors present in electro optical display apparatus to allow driver circuitry to be wire bounded thereto and the resulting electro-optical display apparatus obtained through the use of such techniques.

The difficulty of providing a large number of connections to finely spaced conductors has become legend with respect to large scale integrated circuits (LSI) and even more pronounced with respect to very large scale integrated circuit devices (VLSI). Difficulties there encountered become even more extreme when one considers the connection requirements associated with the fabrication of monolithic flat panel display apparatus such as electrophoretic display panels.

In devices of this type such as described in U.S. application Ser. No. 670,571, now U.S. Pat. No. 4,655,897, as entitled "Electrophoretic Display Panels and Associated Methods" as filed on Nov. 13, 1984 in the names of Frank J. DiSanto, Sr. and Denis A. Krusos, the inventors herein, and assigned to the assignee herein, as well as in U.S. application Ser. No. 799,458 entitled "Electrophoretic Display Panel Apparatus and Methods Therefor" as filed on Nov. 19, 1985 in the names of the instant inventors and assigned to the present assignee, resolution of 200 lines per inch is obtained in a display having a conductor density of 200 lines per inch in each of the row and column directions. Thus, in a typical display having dimensions which correspond to the typical dimensions of an 8½ by 11 inch sheet of paper 2200 row conductors and 1700 vertically disposed column conductors would be utilized. Each conductor in the 2200 by 1700 conductor matrix formed requires connection to driver circuitry and resolution surpassing more than 200 lines per inch is envisioned.

The row and column conductors of such displays are typically etched upon the glass layer forming the display as such fine line patterns are not available through the use of other techniques. When the display is assembled, each of the 2200 row conductors and 1700 column conductors are brought out to the periphery of the panel formed where connection is typically made to driver circuits for selectively energizing the rows and columns to form patterns in accordance with data to be displayed. Typically, individual driver circuits in the form of integrated circuits are employed to drive a designated group of conductors from the periphery of the column and row. In this vein a typical driver circuit is capable of driving 64 individual conductors where the driver circuit receives 10 inputs provided by electronics external to the electrophoretic panel.

Connection to the driver circuits at the periphery of the electrophoretic panel is preferably achieved during the fabrication of the panel since alignment problems can occur due to the conductor densities involved. In such an arrangement each group of 64 row and column conductors may be specially configured at the periphery of the display to accommodate connection to specific driver chips; however, the entire assembly process is time consuming and costly. The assembly process also is typically subject to alignment errors and is often attended by reliability problems.

One technique for achieving suitable connection of the row and column conductors present in a high resolution electrophoretic display is set forth in U.S. Pat. No. 4,598,960 which is entitled "Methods and Apparatus for Connecting Closely Spaced Large Conductor Arrays Employing Multiconductor Carrier Boards" and issued on July 8, 1986 to the inventors herein and is commonly assigned. According to the techniques described in U.S. Pat. No. 4,598,960 a driver circuit in the form of an integrated circuit is mounted on a carrier board. The driver circuit interconnects with 64 etched output conductors on the carrier board as well as 10 input conductors. The carrier board is specially configured through the use of data apertures to align with correspondingly grouped row or column conductors of the electrophoretic display under such circumstances that the data apertures are aligned with mounting posts mated to the base plate of the assembly and insure appropriate alignment of the carrier boards. Connection of the carrier board outputs to the row and column conductors within the electrophoretic display is mechanically achieved through the us of Zebra connectors and this same technique is employed to provide connection to the inputs of the carrier board. Connection of the carrier board to the integrated circuit is achieved through wire bonding techniques and the entire assembly once fabricated is clamped in place to assure that once appropriate mechanical and electrical alignment is achieved the same will be retained.

While the techniques set forth in U.S. Pat. No. 4,598,960 are effective, they are subject to a number of difficulties and result in a display assembly which is complex, costly to fabricate, and subject to a number of reliability problems both during initial fabrication and after periods of use. For example, the ceramic carrier boards employed are costly and the data apertures provided therein must be accurate within one ten thousandth of an inch or else alignment problems may result. In addition, assembly of the complex structure is time consuming which increases manufacturing costs and the mechanical connections achieved with the Zebra connectors can be subject to reliability problems in the presence of substantial vibration as can the clamps employed.

Therefore, it is a principal object of the present invention to provide improved monolithic flat panel display apparatus and methods for the fabrication thereof.

A further object of this invention is to provide electrophoretic display apparatus and methods for the fabrication of the same wherein row and column driver circuits are directly bonded to the display panel and connected to individual conductors therein through use of wire bonding techniques.

An additional object of the present invention is to provide electrophoretic display apparatus and methods therefor wherein portions of the row and column conductors are patterned and metalized to permit the same to be directly bonded to driver circuits.

Various other objects and advantages of the present invention shall become clear from the following detailed description of an exemplary embodiment thereof and the novel features will be particularly pointed out in conjunction with the claims appended hereto.

SUMMARY OF THE INVENTION

In accordance with the teachings of the present invention, methods for fabricating monolithic flat panel displays are disclosed, together with the resulting display wherein the end portions of the row and column conductors of a display panel are metalized, grouped and patterned to accept a driver circuit within the pattern of each group; the driver circuit is then bonded to the panel and each output of the driver circuit to be employed is wirebonded to the patterned conductor portions within the group associated therewith; inputs to the driver circuit may also be wire bonded to input conductors provided on the panel to provide an integral one piece structure.

BRIEF DESCRIPTION OF THE DRAWINGS

The invention will be more clearly understood by reference to the following detailed description of an exemplary embodiment thereof in conjunction with the accompanying drawings in which.

DETAILED DESCRIPTION

Figure 1:
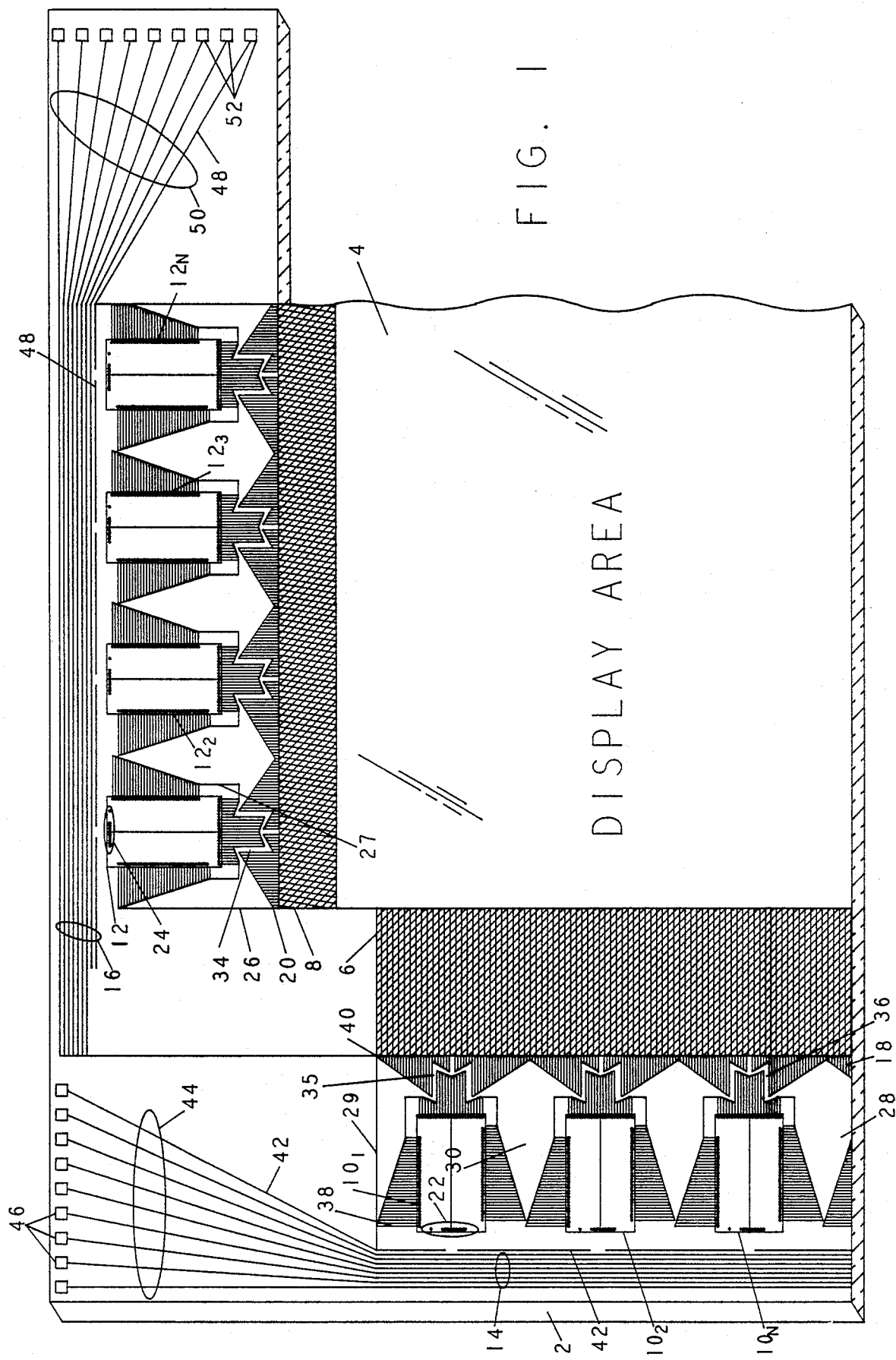
FIG. 1 is a pictorial view illustrating a portion of a preferred embodiment of monolithic flat panel display apparatus according to the instant invention.

Referring now to the drawings and more particularly to FIG. 1 thereof, there is shown a pictorial view illustrating a portion of a preferred embodiment of monolithic flat panel display apparatus according to the instant invention. More particularly, from what has been stated above, those of ordinary skill in the art will appreciate that a typical 8½ by 11 electrophoretic display exhibiting a resolution of 200 lines per inch will comprise some 2200 cathode or row conductors and some 1700 column or grid conductors together with an overlying anode structure. Therefore, in an effort to present an overall appreciation of the instant invention, only the upper left hand corner of such a display has been illustrated in FIG. 1, the left hand corner illustrated comprising approximately 192 row or cathode conductors and 256 column or grid conductors. Those of ordinary skill in the art will appreciate that the same may be treated as a complete display of reduced size or a portion of a larger display, it being understood that all that is required to extend the same to a full size 8½ by 11 display is an extension of what is illustrated in FIG. 1 in the row and column directions.

Figure 2:
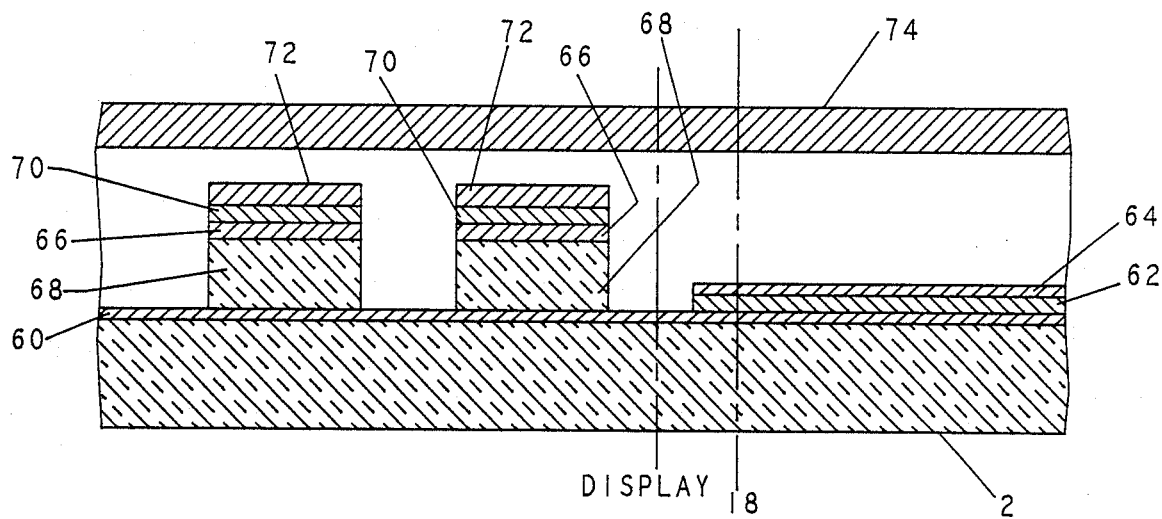
FIGS. 2 is a front view, partially in section, illustrating a portion of the monolithic flat panel display apparatus shown in FIG. 1, depicting the manner in which end portions of row and column conductors may be metalized.

The portion of the prefer-ed embodiment of the monolithic flat panel display apparatus according to the instant invention illustrated in FIG. 1 comprises a glass panel or base plate 2 which, as shall be seen in connection with FIG. 2, is preferably coated with an extremely thin layer of indium-tin-oxide (ITO) as available as described in the aforesaid U.S. patent application Ser. No. 670,571 (now U.S. Pat. No. 4,655,897) from many suppliers. Although glass covered with indium-tin-oxide is preferred, other materials as commonly employed in electrophoretic displays or the like may be used for the base coating. As shall be seen below, the indium-tin-oxide is etched and portions thereof are metalized to form the column and row conductor structure and the drive lines depicted in FIG. I. The coating of indium-tin-oxide on the glass plate 2 has a thickness which may typically range from 100 to 300 angstroms and hence is transparent while yielding a conductor structure which may readily be etched in accordance with the teachings set forth in U.S. patent application Ser. Nos. 670,571 and/or 799,458 as aforesaid. The anode structure for the display illustrated in FIG. 1 is not shown.

The portion of the monolithic flat panel display apparatus illustrated in FIG. 1 comprises a display area 4, row conductors 6, column conductors 8, row driver circuits $10_1$–$10_n$, column driver circuits $12_1$–$12_n$ and input drive lines 14 and 16 for the row and column driver circuits. The display area 4 is shown clear to assist in the depiction thereof, it being recognized that the same has a row and column conductor density of 200 lines per inch in each direction. In fact, Q while the cathode row conductors etched in the ITO layer in the manner described in U.S. application Ser. Nos. 670,571 and 799,458 have a density in the display area 4 of 200 lines per inch, the column or grid conductors 8 formed in the display area will preferably have the 4 tined configuration described in detail in U.S. application Ser. No. 799,458. Hence actual conductor density in the display area in the column direction would be 800 lines per inch. Those of ordinary skill in the art will further appreciate that while the row or cathode conductors etched in the ITO are transparent, the column or grid conductors formed of metal, such as nickel or the like, in the manner described in U.S. application Ser. No. 799,458 are perceivable to a minor degree since a true metal cannot be made fully transparent even though the thickness of the same is extremely reduced. The display area 4 has been shown as clear in FIG. 1 for purposes of ease of illustration and understanding.

The row 6 and column 8 conductors are illustrated in FIG. 1 between the boundary lines 18 and 20 as extending to and from the display in the ungrouped manner in which the same reside within the display area in the horizontal and vertical directions. After the positions indicated by the boundary lines 18 and 20, the row and column conductors 6 and 8 are grouped and patterned to facilitate connection to the row and column driver circuits $10_1$–$10_n$ and $12_1$–$12_n$. The boundary lines 18 and 20 also may be viewed as indicating the location of where metalizing of the row and column conductors in accordance with the teachings of the instant invention may terminate prior to entry of the row and column conductors 6 and 8 into the display area 4. However, as will be readily appreciated as the description herein proceeds, the location of the boundary lines 18 and 20 may vary to suit manufacturing and/or design convenience. While it is not the purpose of the instant disclosure to provide a description of the manner in which monolithic flat panel display apparatus, such as an electrophoretic display, operates those of ordinary skill in the art will appreciate that the display achieved within the display area 4 will be a function of the potential applied to predetermined ones of the row and column conductors 6 and 8 since the potential present at the various intersections of these conductors within the display area will cause a propagation of electrophoretic particles within the display area 4 to achieve the display pattern. A detailed understanding of the operation of electrophoretic displays of the type being described herein may be found in U.S. patent application Ser. Nos. 670,571 and 799,458 as aforesaid.

After the locations indicated by the boundary lines 18 and 20 each of the row and column conductors 6 and 8 within the display apparatus illustrated in FIG. 1 is metalized in a manner to be described in connection with FIG. 2 and grouped and patterned in a manner further described in connection with FIGS. 3 and 4 so as to facilitate connection to the row and column driver circuits $10_1$–$10_n$ and $12_1$–$12_n$.

The row and column driver circuits $10_1$–$10_n$ and $12_1$–$12_n$ each comprise an integrated circuit chip of the type described in U.S. Pat. No. 4,598,960 as aforesaid and perform the functions set forth in that patent as well as the functions described in somewhat greater detail in U.S. application Ser. No. 799,458. Each of the integrated circuits forming the row and column driver circuits $10_1$–$10_n$ and $12_1$–$12_n$ receives ten inputs as indicated generally to the rear of the row driver circuits $10_1$–$10_n$ and to the top of the column driver circuits $12_1$–$12_n$ and in response thereto selectively apply potential to each of the 64 outputs thereof to energize the 64 row and column conductors 6 and 8 connected to the outputs of each of the row driver circuits $10_1$–$10_n$ and column driver circuits $12_1$–$12_n$.

The 64 outputs of each of the row and column driver circuits $10_1$–$10_n$ and $12_1$–$12_n$ are peripherally arranged about three sides of the integrated circuit as generally indicated in FIG. 1. In this regard, it should be noted that in FIG. 1 actual connections to the inputs and outputs of the row and column driver circuits $10_1$–$10_n$ and $12_1$–$12_n$ is not shown for purposes of clarity of illustration. However, the relationship between each of the inputs and outputs of a respective row $10_1$–$10_n$ and column $12_1$–$12_n$ driver chips is readily apparent. The details concerning the actual connection of each input and output of the integrated circuit driver chips will be described in connection with FIG. 4. Here it is sufficient to appreciate that each of the ten inputs to the row driver circuits $10_1$–$10_n$ as generally indicated as 22 in FIG. 1 are supplied from the input drive lines for the row as indicated by the conductors 14 while each of the inputs for the column drive circuits $12_1$–$12_n$ as generally indicated by 24 are connected to individual ones of the drive lines 16.

The outputs of each of the row and column conductor drive circuits $10_1$–$10_n$ and $12_1$–$12_n$, are arranged about the periphery such that as better illustrated in connection with FIG. 3, 24 outputs, i.e. 1–25 and 41–64 are disposed at each side of the chip while the remaining 16 outputs are disposed along the side opposite to the inputs 22 and 24. This, as will be appreciated by those of ordinary skill in the art, maximizes the periphery of the integrated circuit chip from the standpoint of providing locations for discrete inputs and outputs.

Each group of 64 row conductors 6, and 64 column conductors 8 are metalized in a manner to be described in greater detail in connection with FIG. 2 in order to facilitate connection to the outputs of an associated one of the row and column driver circuits $10_1$–$10_n$ and $12_1$–$12_n$ by use of a wire bonding machine. This is done as connection to a conductor formed of ITO or the like is not readily available with a wire bonding machine and nickel, which is commonly employed for the column conductors 8, presents similar difficulties.

In addition to metalizing, each group of 64 conductors is patterned in a manner to be described in greater detail in connection with FIG. 3 to provide a location for the integrated circuit chip serving as the row or column driver circuit $10_1$–$10_n$ and $12_1$–$12_n$ and to dispose each of the 64 metalized conductors in the group at a location so that the same is proximate to an associated one of the 64 outputs on the row or column driver circuit $10_1$–$10_n$ and $12_1$–$12_n$. This is also described in greater detail in connection with FIGS. 3 and 4. Here, to facilitate representation, it should be noted that the arrow-like representations 26–30 and the chevron-like representations 32–36 represent groups of conductors as the detailed pattern employed is better shown in figures such as FIGS. 3 and 4 having less structure. Thus, here it is sufficient to appreciate that with respect to the arrow-like representations 26–30 and the chevron-like representations 32–36, individual row conductors should be viewed as entering a grouping at an aslantly disposed edge thereof for entry into the generalized bundle of row and column conductors 6 and 8 shown between the display area and the boundary lines 18 and 20 and conversely leave the arrow-like representations 26–30 and the chevron-like representations 32–36 along other aslantly disposed edges thereof for application toward an individual output of the driver chips $10_1$–$10_n$ and $12_1$–$12_n$.

By way of example, an individual row conductor 40 may be viewed as entering the arrow-like representation 29 from the generalized row conductors 6 which enters the display area and leave the arrow-like representation 29 at the row conductor location 38 for connection to an output such as output 63 of the row driver circuit $10_1$. Thus, this form of representation will serve to generally provide the reader with an overall understanding of the manner in which 64 row or column conductors are associated with each of the row and driver chips $10_1$–$10_n$ and $12_1$–$12_n$ and readily facilitates an understanding concerning the manner in which the illustration of the embodiment of the invention illustrated in FIG. 1 may be readily extended to accommodate a full 8½ by 11 electrophoretic display panel having 2200 row conductors and 1700 column conductors. In the case of a full scale display 35 row driver circuits $10_1$–$10_n$ and 27 column driver circuits $12_1$–$12_n$ arranged about the periphery of the glass panel or base plate 2 in precisely the same manner illustrated for the portion thereof shown in FIG. 1 would be employed.

The input driver lines 14 for each of the row driver circuits $10_1$–$10_n$ comprise 9 parallel conductors which are etched along the left side of the glass panel 2 in the manner illustrated in FIG. 1 to provide the ten requisite inputs for each of the row driver circuits $10_1$–$10_n$. In this regard, those of ordinary skill in the art will appreciate, upon an inspection of FIG. 1, that drive line 42 within the group of 9 etched input drive lines 14 is split in the vicinity of each of the row driver circuits $10_1$–$10_n$. This is done as the same represents the data-in and data-out drive line since each of the row driver chips $10_1$–$10_n$ are connected in series with respect to their data-in inputs and data-out outputs. Hence, the single drive line 42 within the group of 9 drive lines 14 for the row column drivers $10_1$–$10_n$ is split so that one side of this drive line may be connected to the data-in input of a given one of the row driver circuits $10_1$–$10_n$ while the opposite side is connected to the data-out output of that chip. The same side of the driver line 42 in turn is connected to the data-in input of the adjacent driver circuit chip affecting serial connection of the data-in and data outputs of each of the row driver chips $10_1$–$10_n$ in a manner well known to those of ordinary skill in the art.

Accordingly, the 9 input drive lines 14 effectively supply the 10 input/output connections for each of the row driver circuits $10_1$–$10_n$, it being noted that additional drive lines may be etched within the group 14 should a different row driver circuit configuration be employed. Each of the 9 drive lines 14 within the input drive line group 14 is flared out in the manner indicated at 44 and provided with a contact pad 46 to facilitate connection to external circuitry in the manner well known to those of ordinary skill in the art.

In precisely the same manner, the input drive lines 16 are etched as a group of 9 drive lines to provide 10 input/output connections to the column driver circuits $12_1$–$12_n$. Here, the input drive lines 16 are horizontally disposed along the periphery of the glass panel 2. The drive line 48 is again split in the vicinity of each of the column driver circuits $12_1$–$12_n$ to again facilitate the serial connection of the input of the data-in and data-out connections to each of the column driver circuits $12_1$–$12_n$. As was also the case for the row input drive lines 14, the etched column drive lines 16 are flared out in the manner indicated at 50 toward the right end of the glass panel 2 and contact pads 52 are provided to facilitate connection to external drive circuitry. Those of ordinary skill in the art will readily appreciate that the flared out portion 50 of the etched column drive line 16 will preferably occur subsequent to the location of the last row driver circuit $12_n$ and hence in a display employing 27 column driver circuits $12_1$–$12_n$ the flared out portion of the drive lines 16 would in fact appear at the edge of the display in a comparable manner to that illustrated at 44 for the drive lines 14.

As shall be seen below, connection of each of the inputs and outputs to the row $10_1$–$10_n$ and column $12_1$–$12_n$ driver circuits to the row 6 and column conductors 8 as well as the input/output drive lines 14 and 16 are made by use of a wire bonding machine after the row $10_1$–$10_n$ and column $12_1$$12_n$ driver circuit integrated circuits are epoxy or otherwise bonded to the glass panel or base plate 2. Thus, once the anode structure (not illustrated in FIG. 1) is mounted to the monolithic flat panel display apparatus illustrated in FIG. 1, an integral, one piece display not requiring mechanical assembly other than the mounting of the same within a suitable frame structure is achieved. Further, all electrical connections may be implemented through the use of wire bonding machines or the like to insure rapid assembly and the reliability which attends a structure not requiring mechanical connections of electrical contacts and the attendant clamping associated with such structures. Thus, when compared to the complex structure illustrated in FIG. 7 of U.S. Pat. No. 4,598,960, it will be seen that little more than the electrophoretic panel 70 is required and the complete avoidance of expensive ceramic carrier boards and complex location thereof is achieved.

Referring now to FIG. 2 there is shown a front view, partially in section, illustrating a portion of the monolithic flat panel display apparatus shown in FIG. depicting the manner in which end portions of row and column conductors may be metalized in accordance with the teachings of the instant invention. At the outset it should be noted that the structure of an electrophoretic display such as disclosed in U.S. application Ser. No. 799,458 is preferred as the tined column conductor structure thereof is viewed as highly advantageous and results in an enhanced display. Therefore, the description of FIG. 2 should be considered as if the tined column-grid structure set forth in U.S. application Ser. No. 799,458 were being configured. However, these of ordinary skill in the art will appreciate that the concepts set forth within the instant disclosure are equally applicable to the form of electrophoretic display panels set forth in U.S. application Ser. No. 670,571 or to alternate structures thereof known to the prior art. Conversely, teachings of the instant invention are fully applicable in any application where a great many connections to closely spaced conductors are to be made and those conductors do not normally admit of wire bonding applications.

The portion of the monolithic flat panel display apparatus illustrated in FIG. 2 is a section selected to best illustrate the techniques for selectively metalizing portions of row and column conductors to practice the fabrication methods of the instant invention while essentially leaving the display area free of additional metalizing to retain the transparent nature thereof. For this reason, FIG. 2 has been deliberately drafted out of proportion with respect to FIG. 1 such that distance between the boundary line 18 illustrated in FIG. 1 and the actual beginning of the display area 4 is compressed in the manner indicated by the dashed line 18 and the dashed line annotated Display in FIG. 2. Hence, what is illustrated in FIG. 2 should be understood as depicting in cross section a portion of the glass plate 2 associated with row conductors 6 to the left of the boundary line 18 shown in FIG. 1, shown to the right of the dashed line 18 in FIG. 2 as well as portions of the display area involving the first few column conductors (shown to the left of the dashed line annotated Display in FIG. 2).

As described above, and in greater detail in U.S. application Ser. Nos. 799,458 and 670,571, a glass plate 2, preferably coated with an extremely thin layer of indium-tin-oxide (ITO) 60 as available from many suppliers, acts as a port through which a viewer of the display may discern image information set forth thereon. The ITO layer is extremely thin of the order of 100 to 300 angstroms and hence is truly transparent. The row or cathode conductors 6 are formed within the ITO layer directly on the glass substrate 2 and, as shall be seen below, in the area of the display the row or cathode conductors 6 comprise only the ITO layer to insure that the transparency of the display area is retained. However, in areas external to the display and where contacts to the row or cathode conductors are to be made, these conductors are metalized by overcoating the same with one or more metallic layers characterized by their ability to accept wire bonding and to adhere to the ITO cathode conductors.

The actual configuration of the row and column conductors within the display area 4 is explained in great detail, together with the manner in which the same may be formed in U.S. application Ser. No. 799,458 whose disclosure is specifically incorporated by reference herein. Accordingly, should additional detail concerning the dimensions or techniques for forming the row and column conductors be desired, reference to that application is suggested.

The portion of the monolithic flat panel display apparatus illustrated in FIG. 2 comprises a glass plate 2 overcoated with a thin layer of indium-tin-oxide (ITO)

60. The ITO layer 60, as shall be seen below, is patterned to form row conductors forming the cathodes of the display which have a density, for example, of 200 lines per inch. Thus, in the case of an 8½ inch wide by 11 inch long display area 4 the pattern will be such that 2200 horizontally disposed cathode or row conductors will be etched in a manner to be described below in the row direction. Typically, as described in U.S. application Ser. No. 799,458, each of the row conductors formed will have a width of the order of 112 μm while separation between adjacent row conductors is typically 15 μm. This pattern will exist underlying the entire display area 4 and extending generally to the boundary line 18. After the boundary line 18 patterning of each of the row or cathode conductors is implemented in a manner best appreciated in connection with FIGS. 3 and 4. In addition, after boundary line 18 each ITO row conductor 60 in the portion of the panel outside of the display area 4 and essentially between the boundary line 18 and the periphery of the panel or glass plate 2 is overcoated with one or more metallic layers 62 and 64 patterned, in a manner to be described below, in precisely the same manner as the underlying ITO layer so that effectively the ITO layer outside of the display area 4 is metalized.

After the row or cathode conductors are formed and the peripheral portions of the ITO conductors are metalized in the manner indicated by the layers 62 and 64, column conductors 66 are formed underlying the display area in precisely the manner described in U.S. application Ser. No. 799,458, as aforesaid. In areas of the row conductors external to the display area 4, the row conductors are patterned in the manner best appreciated in connection with FIGS. 3 and 4. In FIG. 2 solid column conductors 66 and insulator pads 68, on which they reside, are illustrated as the cross section shown in FIG. 2 is through a section selected for purposes of showing peripheral portions of the column conductors 66 external to the display area 4 so that the metalizing associated therewith can be depicted. The column conductors 66, however, are preferably formed in the area of the display as multiple tined conductors of the type best illustrated in FIG. 4 of U.S. application Ser. No. 799,458 such that effectively 4 parallel tines form each column conductor in the area of the display. Under these conditions each of the 4 tines has a typical width of 20 μm and has an internal spacing between tines of 13 μm while the spacing, between conductors is 15 μm. Portions of the photoresist pads 68 underlying each of the tines are similarly formed in parallel sections in a manner best illustrated in FIG. 3 of U.S. application Ser. No. 799,458.

The column conductors 66 are also metalized in peripheral portions of the panel external to the display area 4 as indicated by the layers 70 and 72. An anode structure 74 is provided in the manner described in connection with U.S. application Ser. No. 799,458, as aforesaid, and overlies at least portions of the display panel overlying the display area 4.

As was noted above, the glass panel or base plate 2 is typically obtained having a thin layer of ITO formed thereon as a transparent layer. The same then is configured in accordance with the teachings of the instant invention either by first patterning the ITO layer to form the row or cathode conductors 60 in the manner described in U.S. application Ser. No. 799,458. Thereafter the row conductors 60 may be entirely overcoated or peripherally disposed portions thereof outside of the display area 4 are selectively coated with one or more metallic layers 62 and 64. If the entire surface of the ITO row conductors are metalized, the portions of the layers 62 and 64 overlying the ITO row conductors in the display area 4 are then removed by sputter etching or similar wet etching techniques so that the metalized layers are removed in the area of the display enabling the transparent nature thereof to be retained.

Thereafter, the column conductors 66 on the insulating pads 68 are formed in precisely the manner described in association with U.S. application Ser. No. 799,458 as aforesaid. Once this is done, one or more metalized layers 70 and 72 for the column conductors 66 may be formed on peripheral portions of the column conductors. Alternatively, each of the column conductors 66 may be metalized in their entirety by the plating of one or more metallic layers 70 and 72 thereon. Again, portions of the metalizing layers 70 and 72 in the display area 4 may be removed through an etching process or here, the same may be left in tact as the column conductors 66 which are typically formed of nickel are true metals and hence are not transparent regardless of the thickness involved.

If the approach of initially patterning the ITO layer by the formation of row or cathode conductors in the manner set forth in U.S. application Ser. No. 799,458 is followed, the patterning would be conducted in precisely the manner set forth in that application. Thereafter, the metalized layers 62 and 64 would be formed in such a manner that the layer 62 is selected of a metal which displays good adherence qualities to ITO layer 60 while the layer 64 is selected of a metal to which wire bonding may take place. Thus, if multiple layers 62 and 64 are employed, the layer 62 may comprise nickel, chrome or molybdenum while the layer 64 may typically comprise gold or aluminum. Alternatively, a single layer of aluminum or the like may be utilized. In other variations a three layer combination of molybdenum, gold and nickel may be utilized wherein the nickel or molybdenum layer is selected for overcoating on the ITO conductor 60 while the gold layer represents the top layer 64 to which wire bonding will take place.

A typical example of such technique would comprise the steps of initially patterning by forming the ITO image of the row or cathode conductors 60 in precisely the same manner set forth in U.S. application Ser. No. 799,458. Thereafter, approximately 10 millionths of an inch of nickel would be plated on the ITO conductors formed. This would be followed by the plating of approximately 4 millionths of an inch of gold on the nickel. Thereafter, the resulting structure would be baked at approximately 250° C. for 30 minutes. This would be followed by the plating of approximately 40 millionths of an inch of gold on the structure formed.

If the ITO row conductors in the display area 4 were metalized in the foregoing manner, rather than only being metalized in peripheral portions thereof, the display area 4 will be etched to remove the metalizing represented by layers 62 and 64 therefrom in the manner indicated in FIG. 2. This will be accomplished, as will be readily appreciated by those of ordinary skill in the art, by the use of a dry etch affected by way of sputter etching wherein the depth of the etch can be readily controlled. Alternately a wet etch wherein the specific materials, here gold and nickel, are selectively removed by use of commercially available etching solutions such as Aquarega for the gold and nickel etch for the nickel are employed.

Thereafter, the column conductors 66 and insulating pads 68 therefor are formed precisely in the manner described in U.S. application Ser. No. 799,458. The column conductor 66 would typically be formed of nickel as described in that U.S. application Ser. No. 799,458. Thereafter, these column conductors, which act as grids, are metalized by the formation of the layers 70 and 72 thereon. This may be done precisely in the manner described with respect to the formation of the layers 62 and 64. Alternatively, a chrome and gold combination may be employed for the layers 70 and 72 or again a single layer of aluminum may be utilized. If the entire length of the column conductor 66 is metalized, the metalizing material may again be removed from the area of the display 4 by using a dry or wet etch such as noted above or alternatively the metalized layers employed for the column or grid conductors may be left in place in the area of the display area since the column conductor 66 is formed of a true metal and will not be transparent. Therefore slightly increasing the thickness thereof due to the presence of the metalizing layers 70 and 72 will not adversely effect images formed in the display area 4.

Metalizing of the row and column conductors in the manner illustrated in FIG. 2 may be readily implemented by first patterning the row conductors 60 and thereafter selectively metalizing the conductors formed as described above. This will be followed by precisely the same procedure with respect to the column conductors 66. However, it has been found that it is generally more efficient to achieve the structure illustrated in FIG. 2 by first forming the composite layer structure and thereafter selectively patterning the same. This permits the entire structure of the rows to be formed by a singular photomask operation followed by a corresponding photomask procedure for the columns Thus, using this approach, the glass plate 2 bearing the ITO layer 60 would first have metalizing layer 62 formed thereon using conventional sputtering or other well known deposition techniques. Thereafter a second layer 64 would be applied again employing conventional sputtering techniques or the like. Alternatively, a single layer of aluminum or chrome may replace both the layers 62 and 64, it being noted that while a single layer of gold could perform this function it is generally viewed as too soft to be used alone.

Once the ITO layer 60 is completely overcoated with the metalizing layer or layers 62 and 64, the same would be overcoated with a photoresistive layer of any conventional form. Thereafter a photo mask having the conductor pattern associated with the plurality of row conductors and having the end portions patterned in the manner described in connection with FIGS. 3 and 4, is placed on the photoresistive layer formed. The entire structure is then exposed to ultraviolet light through the mask and developed. Those of ordinary skill in the art will appreciate that what remains after the removal of the developed material will comprise the desired conductor pattern for the plurality of row conductors and end portions wherein each conductor will be overcoated with photoresistive material. The remaining portions of the composite metalized structure comprising layers 60, 62 and 64 will not be overcoated with photoresistive material. Once this is achieved the row structure may be etched using conventional etching techniques so that only the composite material comprising layers 60, 62 and 64 overcoated by photoresistive material which corresponds to the mask employed in the exposure step remains. Thereafter, the complete surface area of the glass plate 2 is again exposed to ultraviolet light without the benefit of the mask so that the overcoated photoresistive material on the row conductor pattern formed is now exposed. Upon development, this photoresistive material may be removed leaving the plurality of row conductors in the pattern of the mask formed on the glass plate 2.

Removal of the metalizing layers 62 and 64 on portions of the row conductors 60 in the display area 4 is then accomplished by conventional etching such as dry etching accomplished through the use of sputter etching techniques wherein the depth of the etch can be uniformly controlled. Alternatively, wet etching techniques may be utilized employing commercially available material selective etching liquids.

Once the plurality of row conductors, metalized in portions of the display area 4 external to the display area 4, have been formed, formation of the column conductors may take place. This is initiated, as will be appreciated by those of ordinary skill in the art, by overcoating the entire surface of the panel including the previously formed and metalized row conductors with a insulating material. Once the insulating material has been entirely overcoated on the surface of the glass plate 2 having the metalized column conductors formed thereon, the insulating layer is overcoated with a thin layer of nickel in the manner described in U.S. application Ser. No. 799,458. Alternatively, a thin layer of aluminum, which will not require further metalizing, may be employed.

Assuming, however, that nickel is utilized for the column conductors 66, the layers 70 and 72 are overcoated on the nickel in precisely the same manner described for the layers 62 and 64. Here it should be appreciated that since the complete surface is being overcoated a layer at a time sputtering techniques, such as use of planar magnitrons or the like, may be readily employed. Once the thin layers 66, 70 and 72 are overcoated on the insulating layer 68, a photoresistive layer (not shown) is formed over the top metalizing layer 72 which may be gold. The structure of the layers 66, 70 and 72 may be nickel, chrome and gold; nickel, molybdenum and gold; nickel, chrome and aluminum; nickel, molybdenum and aluminum; or, alternatively, a single aluminum layer may replace the three layers 66, 70 and 72.

Once this sandwich-like structure is formed, a photoresistive layer (not shown) is formed over the top layer 72 to enable the plurality of vertically disposed column or grid conductors to be formed through conventional etching techniques. Thus, a mask corresponding to the pattern of the column conductors in the tine arrangement described in U.S. application Ser. No. 799,458 and having the end portions patterned in the manner described in connection with FIGS. 3 and 4 is placed over the photoresist and the photoresist is exposed to ultraviolet light. Thereafter, the photoresist is developed enabling the removal of the photoresist from portions of the surface in which the initial layer of photoresist 68 and nickel layer 66 and the metalized layers 70 and 72 are not to be retained.

After the exposed and developed portions of the top layer of photoresist material (not shown) is removed, the exposed metal areas are etched to yield the resulting structure shown in FIG. 2 except that the conductor 72 will be overcoated by a layer of photoresist material which has not yet been exposed. The etching procedure is precisely as described in U.S. application Ser. No.

799,458. Thereafter, the resulting structure is again exposed to ultraviolet light so that the photoresistive material overlying layer 72 may be developed and removed. Once this has been achieved, the metalizing layers 70 and 72 overlying the display area 4 maybe selectively etched so as to only leave the metalizing layers 70 and 72 in the peripheral portions of the panel formed outside of the boundary line 18. Alternatively, in the case of the column conductors 66, the metalizing layers 70 and 72 may be left in the display area 4 since the column conductors 66 are not transparent.

Figure 3:
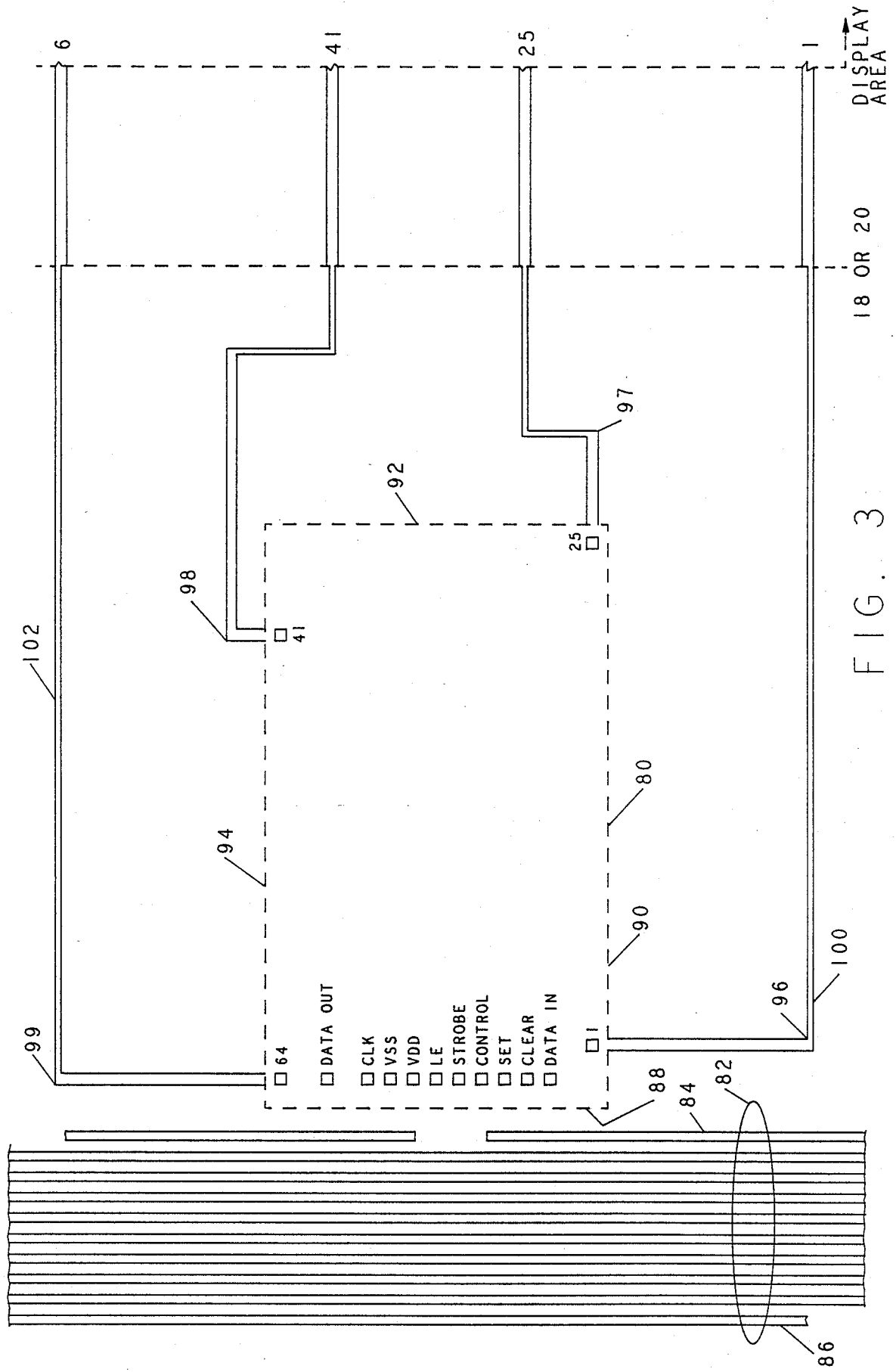
FIG. 3 is a top view illustrating the manner in which end portions of row or column conductors may be grouped and patterned for accepting a driver circuit.

Referring now to FIG. 3 there is shown a top view illustrating the manner in which end portions of row and column conductors are grouped and patterned for accepting a driver circuit. More particularly, each group of 64 row and column conductors in the monolithic flat panel display illustrated in FIG. 1 is arranged and patterned in the manner illustrated in FIG. 3 so as to accept and subsequently be connected to an associated row or column driver circuit $10_1$-$10_n$ or $12_1$-$12_n$. Those of ordinary skill in the art will appreciate that in the case of an 8½ by 11 display having approximately 2200 row conductors and 1700 column conductors, 35 groupings for row driver circuits $10_1$-$10_n$ would be present while 27 column groupings for column driver circuits $12_1$-$12_n$ would be present. Each grouping formed would being identical to that illustrated in FIG. 3. In FIG. 3 an exemplary row or column driver circuit has been indicated by the dashed block 80 to illustrate the outline of the driver chip per se and exemplary outputs 1, 25, 41 and 64 have been illustrated, together with the 10 I/O connections thereto. An associated input/output drive line array 82, corresponding to an appropriate one of the input/output drive line arrays 14 and 16 illustrated in FIG. 1 has also been indicated in FIG. 3.

The 9 conductor I/O drive line array 82 is etched at the peripheral portion of the array as indicated in FIG. 1 so as to provide 9 parallel conductors in the manner illustrated in FIG. 3. The closest conductor 84 to the chip location 80 is split so as to provide for the serial connection of each row or column driver to the single split line to obtain the serial connection of the data-in and data-out outputs of each chip, as aforesaid. While not illustrated in FIG. 3 the split conductor 84 may be somewhat thickened with respect to the remaining conductors within the I/O drive line array 82 to facilitate test probing of the input and output signals. Although any convenient spacing and arrangement maybe employed for the I/O drive line array 82, a convenient arrangement for embodiments of the instant invention which have been built and tested, is to provide an I/O drive line array wherein each conductor has a typical width of 0.010 inch and is spaced from the adjacent conductor within the array by a distance of 0.001 inch. The initial conductor in the array, i.e. conductor 86, is typically disposed 0.1832 inch from the edge of the glass plate 2 and the distance allotted between the edge of the last conductor 84 in the array and the rear edge 88 of the row or column driver 80 is 0.010 inch. The I/O drive line array 82 may be printed on the glass plate employing conventional photomask techniques such as described above with respect to the formation of the row and column drivers.

The row or column driver 80 which may be conventional will have nominal dimensions of 0.2428 inch by 0.1448 inch with the shorter dimension obviously located along the edge 88 illustrated in FIG. 3. The specific input/output connections to and from this chip as provided in the I/O drive line array 82 are specifically indicated as disposed near the edge of the chip 88 and have been annotated with their function to render their character apparent. Those of ordinary skill in the art will appreciate the specific nature of the inputs and outputs provided on the driver chip 80 may be varied to suit the choice of the designer.

The location of the initial and end output pads on each of the remaining three sides 90, 92 and 94 of the driver chip 80 are indicated while the boundary lines 18 and 20 illustrated in FIG. 1 have also been indicated by way of the dashed line annotated 18 or 20 in FIG. 3. Although only 4 exemplary conductors have been shown in FIG. 3, the interrelationship in the patterning among the conductors in each 64 conductor group may be appreciated upon an inspection of FIG. 4 which shows an exemplary grouping of conductors.

As will be seen upon an inspection of FIG. 3, each of the 64 conductors to be connected to a specific driver chip 80 is brought out from the display area having the same width as was employed in the display area. In this case this width corresponds to approximately 0.0033 inches, although spacing may vary from 112 to 115 $\mu$m. In the case of the four tine column conductors described in U.S. application Ser. No. 799,458 each of the four tines of a specific conductor are joined into a single column conductor subsequent to its leaving the display area and for this purpose, if desired, slightly enlarged pad areas may be employed. Thus, until the location indicated by the boundary line 18 or 20 the width of each conductor is retained at that employed in the display area.

Figure 4:
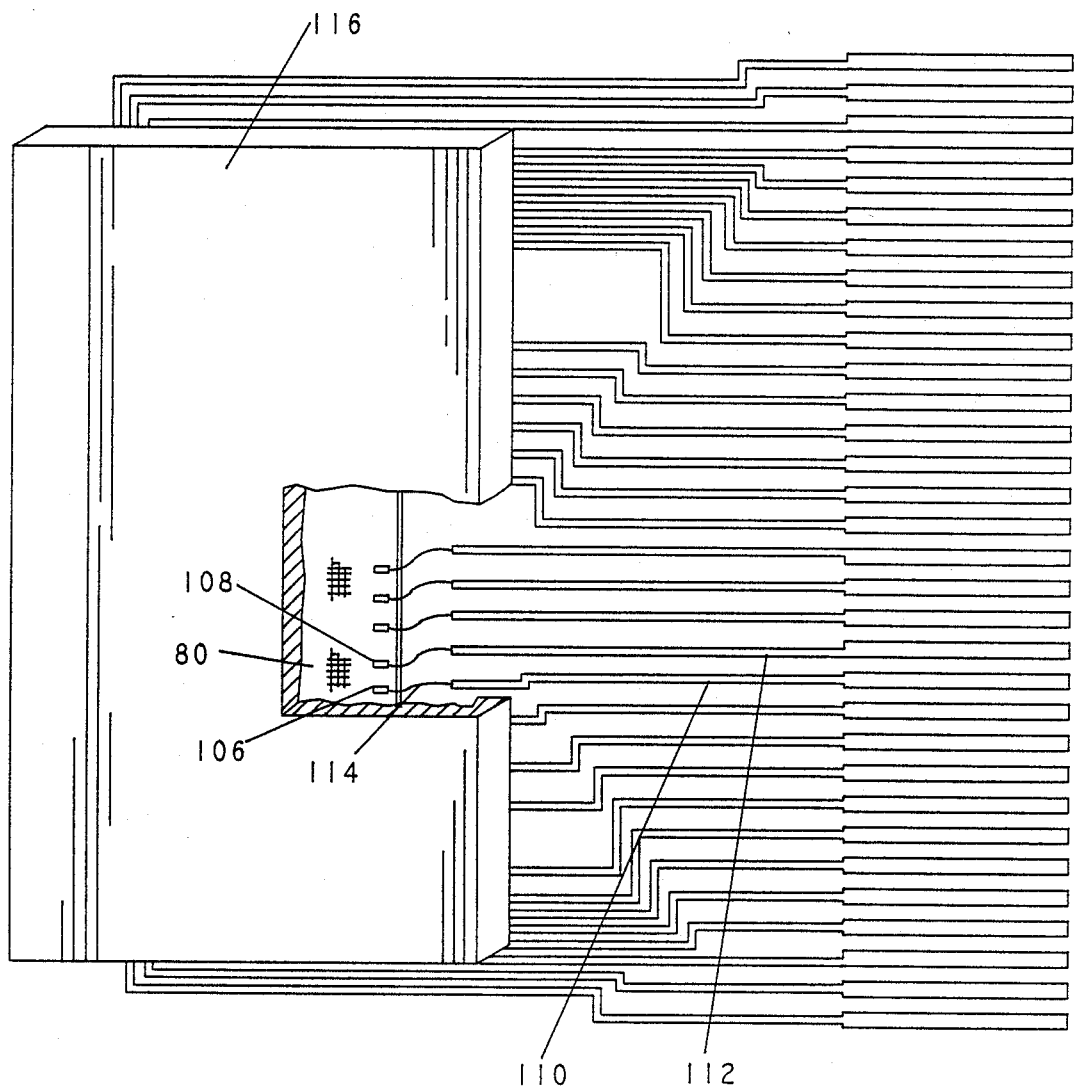
FIG. 4 is a top view illustrating the manner in which a driver circuit is mounted and connected to end portions of row or column conductors on a monolithic flat panel display.

After the boundary area indicated by the dashed line 8 or 20, the width of each of the 64 row or column conductors within a specific group is thinned by approximately one half to a typical thickness of 0.0015 inch to facilitate the patterning illustrated in FIGS. 3 and 4 and brought to a location 96-99 where it is directly opposite to the pad 1, 25, 1, 64 on the row or column driver 80 to which connection is to be affected. At this location, the conductor is again thickened in the manner indicated in FIGS. 3 and 4 so as to have a width which corresponds to the approximate 4 mil width of each of the pads 1, 25, 41 and 64 of the row or column driver chip 80. Thus, in configuring the mask the 4.25 mil width of each row or driver conductor brought out from the display area to the boundary line 18 or 20 is first reduced to a width of 1 and ½ mils to facilitate patterning. Thereafter once the same is brought opposite to the pad on the driver chip 80 to which connection is to be made the width is expanded to 4 mils so as to correspond in width of the connection pad on the driver chip 80. The patterning of each of the 64 conductors to be connected to an individual row or driver chip 80 may be achieved through conventional photomask techniques such as described in connection with the formation of the row and driver conductors. As indicated in FIG. 3, each of the 64 row or driver conductors once patterned is brought to a location indicated by the dashed edges 90, 92 and 94 of the row or driver chip 80 which essentially corresponds to where that edge will reside once the row or column driver 80 is mounted in the array being formed.

The distance between the edge of the driver chip 92 and the boundary line 18 or 20 may typically be 0.128 inch. The distance from the edges 90 and 94 of the driver chip 80 to the outer edges of the conductors 100 and 102, the conductors connected to outputs 1 and 64 of the driver chip 80, may typically be 0.08675 inch. Thus, it will be seen that the 64 row or column conductors grouped for connection to a particular row or column driver chip 80 are patterned in the manner illustrated in FIG. 3 and further shown in FIG. 4 so as to provide a location for the row or column driver chip 80 per se as indicated by the dashed lines 88, 90, 92 and 94 in FIG. 3 and to bring each of the conductors to a location connection pad at a width corresponding to the pad width of the output on the row or column driver 80 to which it is to be connected. Further, the thinning of the conductor width between the location indicated by the boundary line 18 or 20 and its location opposite to the pad to which it is to be connected readily facilitates the patterning being conducted. This can readily be achieved through the use of the same photomask techniques described in connection with the formation of the row and column drivers.

Once the entire conductor structure for the monolithic flat panel display apparatus illustrated in FIG. 1 is formed in the manner described in connection with FIGS. 2 and 3, the actual row and column drivers $10\text{-}1\text{-}10_n$ and $12\text{-}1\text{-}12_n$ are mounted on the panel formed. More particularly, through the use of a conventional chip mounting machine, each of the row and driver chips $10_1\text{-}10_n$ and $12_1\text{-}12_n$ have a small spot of low temperature thermal setting epoxy or similar adhesive placed on the bottom thereof and the same are positioned again through the use of a chip mounting machine or the like within the outline provided as indicated by the dashed lines 88, 90, 92 and 94 in FIG. 3. Once all of the row and column driver chips $10_1\text{-}10_n$ and $12_1\text{-}12_n$ are properly positioned in the location indicated by the dashed lines 88, 90, 92 and 94 in FIG. 3 on the array, the entire panel is placed in an oven set at a temperature of approximately 120° C. for approximately 2 hours to allow the epoxy bond formed intermediate the bottom surface of the row or column driver chip 80 and the display panel to cure.

Once this has been completed, actual connection of each of the 64 row or column conductors in a group is made to each of the 64 outputs of the row or column driver chip 80 and each of the 10 input/outputs at the rear of the chip along the edge 88 is connected to associated ones of the conductors within the I/O drive line array 82. The manner in which this is achieved is best appreciated in connection with FIG. 4.

Referring now to FIG. 4 there is shown a top view illustrating the manner in which a driver circuit is mounted and connected to end portions of the patterned row or column conductors within a group of 64 conductors in the monolithic flat panel display apparatus according to the instant invention. More particularly, as shown in FIG. 4, the row or column driver circuit 80, once epoxied or otherwise adhered to the glass panel or base plate 2, must have each of the contact pads 106 and 108 on the top surface thereof connected to associated ones of the row or column conductors 110 or 112, in the manner indicated in FIG. 4. To achieve this function, the entire monolithic panel formed is placed in a wire bonding machine so that each of the pads 106 and 108 may be connected to corresponding conductors 110 and 112. The wire bonding machine is loaded with gold or aluminum wire and the wire bonding machine is set up for an appropriate ultrasonic bonding cycle. Thereafter, connection is typically initiated at the pad 106 or 108 on the driver chip, the preferred loop in the wire 114 is set and thereafter bonding to a conductor 110 occurs.

This process is continued by the operator from one contact pad 106 or 108 to the next until each of the 74 contact pads on the driver circuit 80 is connected wherein outputs 1-64 are connected to the 64 grouped row or column conductors associated with the display area while the 10 inputs to the driver circuit are connected to respective ones of the conductors within the I/O drive line array 82. If a manual wire bonding machine is employed, this operation will take 10 to 15 minutes per driver chip 80. However, if an automatic wire bonding machine is utilized, once setup has been established, bonding of the 74 contact pads to appropriate conductors will occur at a rate of approximately one chip each nine seconds. The scrubbing cycle for the vibrator is typically set to approximately 40 milliseconds in the bonding operation being carried out.

Further, since the pad and matching conductor widths are approximately 4 mils, the connection operation is well within the precision of most conventional wire bonding machines since connection within 1 mil of center is sufficiently accurate for purposes of the instant invention. Once an entire driver chip has been interconnected to its inputs and outputs as described above, a protective cover 116, as illustrated in FIG. 4, is placed over the driver circuit 80 to protect the circuit per se and each of the wire bonds made to the pads thereof. The cover 116 may be formed of ceramic or epoxy material.

Thus, those of ordinary skill in the art will appreciate that the instant invention allows wire bonding techniques to be employed to secure an integrated monolithic structure which is highly simplified and readily admits of large scale integrated circuit processing techniques despite the highly complex nature thereof. Further, this occurs despite the fact that ITO is typically employed as a conductive, transparent layer from which cathode grid conductors are formed.

Although the instant invention has been described in connection with a highly specific exemplary embodiment thereof, it will be understood that many modifications and variations, particularly with regard to dimension, will occur to those of ordinary skill in the art. Therefore, it is manifestly intended that this invention be only limited by the claims and the equivalents thereof.

What is claimed is:

1. A method of fabricating a monolithic flat panel display comprising the steps of:

forming thin closely spaced cathode conductors on a substrate, said thin closely spaced cathode conductors being formed in a manner to define a display area where said cathode conductors are substantially transparent and a patterned area where said cathode conductors are metalized by the addition of at least one layer of metal, said patterned area being configured by a plurality of closely spaced conductors grouped for purposes of receiving driving potential into driver groups where a pattern is formed to accommodate driver circuit means on said substrate within said pattern formed; and depositing thin closely spaced grid conductors on said substrate transversely to said closely spaced cathode conductors, said closely spaced grid conductors being insulated from said cathode conductors and intersecting said cathode conductors in said display area, said closely spaced grid conductors being grouped and patterned at portions thereof external to said display area for purposes of receiving driving potential into driver groups where a pattern is formed to accommodate driver circuit means on said substrate within the pattern formed.

2. The method of fabricating a monolithic flat panel display according to Claim 1 additionally comprising the steps of positioning driver circuit means on said substrate at locations in each patterned area of a driver group formed to accommodate said driver circuit; and adhering positioned driver circuit means to said substrate.

3. The method of fabricating a monolithic flat panel display according to claim 2 additionally comprising the step of wire bonding connections between each output of said driver circuit means on said substrate to an associated one of said closely spaced connectors within said patterned area of said driver group formed to accommodate said driver circuit means.

4. The method of fabricating a monolithic flat panel display according to claim 1 wherein the step of forming thin closely spaced cathode conductors on a substrate includes the steps of initially forming thin closely spaced cathode conductors on a substrate and thereafter metalizing at least selected portions thereof external to said display area.

5. The method of fabricating a monolithic flat panel display according to claim 4 wherein the step of metalizing at least selected portions external to said display area includes the steps of coating substantial portions of each thin closely spaced cathode conductor formed with a metallic layer and etching the metallic layer formed from said display area.

6. The method of fabricating a monolithic flat panel display according to claim 1 wherein the step of metalizing at least selected portions external to said display area includes the step of applying a metallic layer to portions of each thin closely spaced cathode conductor formed external to said display area.

7. The method of fabricating a monolithic flat panel display according to claim 1 wherein the step of forming thin closely spaced cathode conductors on a substrate includes the steps of overcoating a thin transparent layer on said substrate with a metallic layer and forming said thin closely spaced cathode conductors on said substrate from said thin transparent layer and said overlying metallic layer.

8. The method of fabricating a monolithic flat panel display according to claim 7 additionally comprising the step of etching the metallic layer formed from said display area.

9. The method of fabricating a monolithic flat panel display according to claim 8 wherein said metallic layer is formed of a metal selected from one of gold, aluminum, molybdenum, nickel and chrome.

10. The method of fabricating a monolithic flat panel display according to claim 7 wherein said metallic layer comprises first and second layers, said first layer being formed of a metal selected from one of molybdenum, nickel and chrome and said second layer being formed of a metal selected from one of gold and aluminum.

11. The method of fabricating a monolithic flat panel display according to claim 10 additionally comprising the steps of:

positioning driver circuit means on said substrate at locations in each patterned area of a driver group formed to accommodate said driver circuit; and adhering positioned driver circuit means to said substrate.

12. The method of fabricating a monolithic flat panel display according to claim 11 additionally comprising the step of wire bonding connections between each output of said driver circuit means on said substrate to an associated one of said closely spaced connectors within said patterned area of said driver group formed to accommodate said driver circuit means.

13. The method of fabricating a monolithic flat panel display according to claim 12 additionally comprising the step of etching the metallic layer formed from said display area.

* * * * *